United States Patent
Shimabukuro

(10) Patent No.: US 10,317,472 B2
(45) Date of Patent: Jun. 11, 2019

(54) POWER STORAGE SYSTEM FOR PREDICTING ABNORMALITY OR FAILURE OF THE SYSTEM BY USING MULTIVARIATE ANALYSIS

(71) Applicant: MURATA MANUFACTURING CO., LTD., Kyoto (JP)

(72) Inventor: Hiroshi Shimabukuro, Kanagawa (JP)

(73) Assignee: MURATA MANUFACTURING CO., LTD. (JP)

( * ) Notice: Subject to any disclaimer, the term of this patent is extended or adjusted under 35 U.S.C. 154(b) by 99 days.

(21) Appl. No.: 14/917,713

(22) PCT Filed: Aug. 22, 2014

(86) PCT No.: PCT/JP2014/004336
§ 371 (c)(1),
(2) Date: Mar. 9, 2016

(87) PCT Pub. No.: WO2015/040797
PCT Pub. Date: Mar. 26, 2015

(65) Prior Publication Data
US 2016/0216338 A1    Jul. 28, 2016

(30) Foreign Application Priority Data
Sep. 18, 2013   (JP) ................. 2013-192554

(51) Int. Cl.
*G01R 31/36* (2019.01)
*G01R 31/367* (2019.01)
*H02J 7/00* (2006.01)

(52) U.S. Cl.
CPC .............. *G01R 31/367* (2019.01); *H02J 7/00* (2013.01); *H02J 7/0052* (2013.01)

(58) Field of Classification Search
CPC ........ H02J 7/00; H02J 7/0052; G01R 31/3651
See application file for complete search history.

(56) References Cited

U.S. PATENT DOCUMENTS

2006/0284600 A1* 12/2006 Verbrugge ........... G01R 31/367
320/132
2012/0116722 A1* 5/2012 Yousfi-Steiner ..........................
G06K 9/00496
702/185

(Continued)

FOREIGN PATENT DOCUMENTS

JP      HEI 10-124766      5/1998
JP      2007-132738 A      5/2007

(Continued)

OTHER PUBLICATIONS

International Search Report and Written Opinion prepared by the Japanese Patent Office dated Sep. 26, 2014, for International Application No. PCT/JP2014/004336.

(Continued)

*Primary Examiner* — Mushfique Siddique
(74) *Attorney, Agent, or Firm* — Sheridan Ross P.C.

(57) ABSTRACT

A power storage system includes: a power storage unit including a storage battery, a charging section that charges the storage battery, and a detection section that detects at least one status of the storage battery and the charging section from a plurality of perspectives; and an abnormality detection unit including an input section that acquires transmission information from the power storage unit via a transmission path, the transmission information including a plurality of detected status values, and an abnormality detection section that detects abnormality of the power storage unit by a multivariate analysis performed on the plurality of acquired status values.

2 Claims, 11 Drawing Sheets

(56) References Cited

U.S. PATENT DOCUMENTS

| | | | | |
|---|---|---|---|---|
| 2013/0158917 A1* | 6/2013 | Uchida | .............. | H01M 10/441 702/63 |
| 2014/0089692 A1* | 3/2014 | Hanafusa | .............. | H01M 10/48 713/310 |
| 2015/0061573 A1* | 3/2015 | Masato | .............. | H01M 10/441 320/107 |
| 2016/0085237 A1* | 3/2016 | Yunoki | ................... | H04L 29/14 726/22 |
| 2017/0059665 A1* | 3/2017 | Toya | ..................... | G01R 31/40 |

FOREIGN PATENT DOCUMENTS

| | | | |
|---|---|---|---|
| JP | 2008-547037 A | 12/2008 | |
| JP | 2009-250796 A | 10/2009 | |
| WO | WO 2009/158225 | 12/2009 | |
| WO | WO 2009158225 A2 * | 12/2009 | ......... G01R 31/3651 |

OTHER PUBLICATIONS

Official Action (no translation available) for Chinese Patent Application No. 201480050398.8, dated Apr. 28, 2018, 7 pages.
Official Action (no translation available) for Chinese Patent Application No. 201480050398.8, dated Sep. 17, 2018, 3 pages.

\* cited by examiner

POWER STORAGE SYSTEM FOR PREDICTING ABNORMALITY OR FAILURE OF THE SYSTEM BY USING MULTIVARIATE ANALYSIS

CROSS REFERENCE TO RELATED APPLICATIONS

This application is a national stage application under 35 U.S.C. 371 and claims the benefit of PCT Application No. PCT/JP2014/004336 having an international filing date of 22 Aug. 2014, which designated the United States, which PCT application claimed the benefit of Japanese Patent Application No. 2013-192554 filed 18 Sep. 2013, the disclosures of which are incorporated herein by reference in their entirety.

TECHNICAL FIELD

The present technology relates to a power storage system that predicts a failure by using a multivariate analysis.

BACKGROUND ART

Recently, a technology has been put into practical use, which detects abnormality before a system or device (hereinafter, called monitoring target) reaches its service stop by a failure during an operation of the monitoring target by the pattern recognition technology such as a Mahalanobis-Taguchi system as one of multivariate analysis techniques, and prompts an appropriate measure.

In this technology, after it is ensured that the monitoring target exhibits a normal behavior, the monitoring target is previously tested using various use cases, and a database (hereinafter, called reference database or reference data set) representing a normal space is established from the aggregate of multidimensional data (hereinafter, called operation data set) acquired by various sensors of the monitoring target. The normal space represented by the reference database and a currently acquired operation data set are analyzed by the pattern recognition technology described above. On the basis of the magnitude of a numerical value acquired as an analysis result, the numerical value indicating incompatibility between a reference value and the current monitoring target, abnormality is then detected.

When a reference database is established, every use case when the monitoring target is operated is assumed, and information from a sensor that is involved by the behavior of the monitoring target is acquired as an operation data set, to establish the reference database. In an actual operation of the monitoring target, however, an exceptional behavior of the monitoring target, which results from an event that could not been assumed when every use case was assumed, may occur due to an environment where the monitoring target is located, characteristics of a load connected to the monitoring target, and the like. When such an exceptional behavior increases the numerical value indicating incompatibility, there is a possibility that, though this behavior falls within the range of normality, this is erroneously detected to be abnormal.

In this regard, the technology of updating the reference database during the operation of the monitoring target has been developed. For example, Patent Document 1 discloses a technology in which a reference database is updated in an environment monitoring system that detects environmental abnormality by using the Mahalanobis-Taguchi system.

In this environment monitoring system, a Mahalanobis distance is calculated from a data set acquired in an actual monitoring, and whether the calculated Mahalanobis distance in the monitoring is close to a reference Mahalanobis distance or not is determined. When it is determined to be close, the data set providing the Mahalanobis distance in the monitoring is newly added to an existing reference database to update the reference database, and when the reference Mahalanobis distance is updated, environmental abnormality is detected using the updated reference Mahalanobis distance.

In other words, when the numerical value indicating incompatibility of the operation data set to the reference database, the operation data set being acquired when the operation is monitored, is equal to or smaller than a certain reference, such a numerical value is allowed, and the reference database is updated so as to include the operation data set therein. In the case where a similar event occurs again, this event is not detected to be abnormal.

Patent Document 1: Japanese Patent Application Laid-open No. Hei 10-124766

SUMMARY OF INVENTION

Problem to be Solved by the Invention

In the abnormality detection system, however, the technique for updating the reference database in the operation has various improvements, such as causing a possibility in which a reference Mahalanobis distance changes along with repeated updates of the reference database by using various data sets in operations, and sensitivity to detect abnormality is deteriorated.

In view of the circumstances as described above, it is an object of the present technology to provide a power storage system capable of appropriately detecting abnormality.

Means for Solving the Problem

In order to achieve the above object, according to an embodiment of the present technology, there is provided a power storage system including: a power storage unit including a storage battery, a charging section that charges the storage battery, and a detection section that detects at least one status of the storage battery and the charging section from a plurality of perspectives; and an abnormality detection unit including an input section that acquires transmission information from the power storage unit via a transmission path, the transmission information including a plurality of detected status values, and an abnormality detection section that detects abnormality of the power storage unit by a multivariate analysis performed on the plurality of acquired status values.

In order to achieve the above object, according to the embodiment of the present technology, in the power storage system, the abnormality detection unit may further include a first storage section that stores a reference data set defining a normal state of the power storage unit by the plurality of status values, and the abnormality detection section of the abnormality detection unit may be configured to evaluate incompatibility between the plurality of acquired status values and the stored reference data set, and update the reference database on the basis of an evaluation result.

In order to achieve the above object, according to the embodiment of the present technology, the power storage system may further include a repeater unit including a first control section, the first control section being provided on the transmission path connecting the power storage unit and the abnormality detection unit, receiving the transmission information transmitted from the detection section, changing the status value on the basis of the status value included in the received transmission information, and transmitting the transmission information including the changed status value to the input section.

In order to achieve the above object, according to the embodiment of the present technology, in the power storage system, the first control section of the repeater unit may be configured to add flag information to the transmitted transmission information, the flag information indicating that the status value has been changed.

In order to achieve the above object, according to the embodiment of the present technology, in the power storage system, the abnormality detection unit may further include a second storage section that stores a backup of the reference data set, and the power storage system may further include a sensitivity test execution unit including a second control section, the second control section causing the first control section of the repeater unit to transmit the transmission information changed for a test to the input section, causing the abnormality detection section of the abnormality detection unit to determine whether the power storage unit is abnormal or not on the basis of the received transmission information for a test, and in any of a case where the status value by which the power storage unit is determined to be abnormal is set in the received transmission information for a test, and the abnormality detection unit determines that the power storage unit is normal, and a case where the status value by which the power storage unit is determined to be normal is set in the received transmission information for a test, and the abnormality detection unit determines that the power storage unit is abnormal, causing the abnormality detection section of the abnormality detection unit to write the backup stored in the second storage section back to the reference data set stored in the first storage section.

In order to achieve the above object, according to the embodiment of the present technology, in the power storage system, the second control section of the sensitivity test execution unit may be configured to cause the abnormality detection section of the abnormality detection unit to update the reference data set stored in the first storage section, the reference data set being written back by the backup, on the basis of the transmission information lastly received in an actual operation.

Effects of the Invention

As described above, according to the present technology, it is possible to appropriately perform abnormality detection. It should be noted that the effects described herein are not necessarily limited and any of the effects described herein may be produced.

MODE(S) FOR CARRYING OUT THE INVENTION

Figure 1:
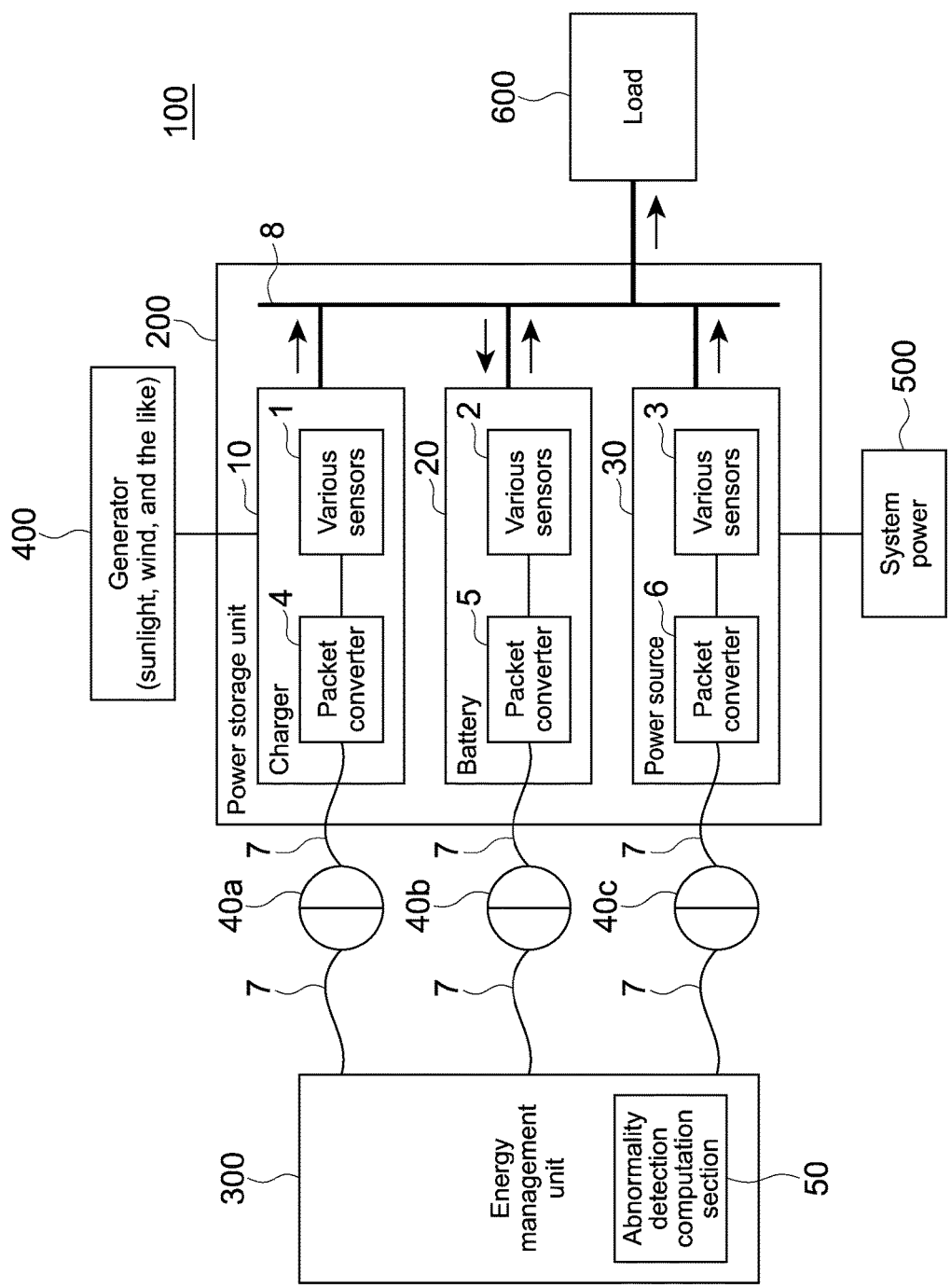
FIG. 1 is a block diagram showing a general outline of the entire power storage system.

Hereinafter, an embodiment of the present technology will be described with reference to the drawings.

[Background where the Present Technology is Developed]

As described above, the abnormality detection system has been developed, in which a reference database representing a normal space is updated by an operation data set newly detected and acquired, during the operation of a monitoring target, and a false detection on normality/abnormality is reduced.

It should be noted that in the above case, the update using the newly acquired operation data set is automatically performed, but it is conceived that a person is caused to intervene here. Namely, in the case where an exceptional event occurs and the abnormality detection system determines that the event is abnormality, but a person determines afterward that the event is not abnormality by checking the event, for example, a reference database is updated so as to include an operation data set representing that event. Through this operation as well, in the case where a similar event occurs later, that event is not detected as abnormality.

In the technique to update the reference database during the operation in such a manner, however, many updates to expand a normal space are made as time proceeds, and as a result of the expansion of the normal space, there is a possibility that the sensitivity of the abnormality detection system for detecting abnormality is deteriorated.

For example, when daily minute noise or fluctuation, which is included in the operation data set, is accumulated in the reference database, the normal space represented by the reference database is expanded, and a numerical value indicating incompatibility is made smaller with respect to data that is to be originally detected as abnormality.

Further, since the number of elements of the reference database is finite, when data of an element constituting the reference database is replaced each time an update is made, the normal space represented by that element up to that time is narrowed. Thus, the numerical value indicating incompatibility, which is an analysis result, is made larger with respect to the event that is to be originally detected as normality, and there occurs a possibility that the event is detected as abnormality.

In other words, in the technique to update the reference database during the operation, repeating updates increases a possibility that a normal event is erroneously detected to be abnormal or an abnormal event to be normal. Therefore, it is an object to overcome this circumstance and develop a system and a method of detecting abnormality more appropriately.

[General Outline of the Present Technology]

In order to achieve this object, in the present technology, the following two mechanisms are incorporated in a monitoring target such that the abnormality detection system having a mechanism to update a reference database keeps constant sensitivity to detect abnormality.

(1) A mechanism to execute a sensitivity test of abnormality detection after a reference database is updated during an operation of a system as a monitoring target.

(2) A mechanism to roll back (write back) the reference database to the reference database before the update, in the case where the result of the sensitivity test is not a desired result (a normal event is determined as abnormality or vice versa).

It should be noted that hereinafter, to describe those two mechanisms, a power storage system is exemplified as a monitoring target. The entire configuration thereof and the configuration of a main part will be described, and then the entire processing flow will be described.

[General Outline and Configuration of Power Storage System]

First, the general outline and the entire configuration of the power storage system will be described.

A power storage system is for charging power generated by natural energy of sunlight, wind, and the like in a storage battery (battery) and supplying power to a connected load while mixing the power with power (system power) supplied from a power system of an electric power company. Use of the power storage system contributes to stabilization of system-power supply or reduction in environmental load. It should be noted that the load used herein means lights, air conditioners, and the like of buildings in the case where the power storage system is installed in office buildings or means lights and electrical appliances in the case of homes.

FIG. 1 is a block diagram showing a general outline of the entire power storage system. A power storage system 100 includes a power storage unit 200, repeaters (repeater units) 40a, 40b, and 40c, and an energy management unit 300. The power storage unit 200 includes a charger (charging section) 10, a battery (storage battery) 20, and a power source (charging section) 30. The charger 10 includes various sensors (detection section) 1 and a packet converter 4. The battery 20 includes various sensors (detection section) 2 and a packet converter 5. The power source 30 includes various sensors (detection section) 3 and a packet converter 6.

Further, the energy management unit 300 includes an abnormality detection computation section (abnormality detection unit) 50. The charger 10, the battery 20, and the power source 30 are connected to one another by a power line 8. The packet converters 4, 5, and 6 and the repeaters 40a, 40b, and 40c are connected to each other by transmission paths 7, respectively. The repeaters 40a, 40b, and 40c and the energy management unit 300 are also connected to each other by the transmission paths 7.

A generator 400 that generates power by natural energy of sunlight, wind, and the like is connected to the charger 10. The charger 10 receives the power generated by the generator 400 and charges the battery 20 via the power line 8. It should be noted that in the case where a charging current when the charger 10 charges the battery 20 exceeds a charging current allowed by the battery 20 or in the case where the battery 20 is fully charged and does not receive the charging current, the power that is received from the generator 400 but is not used for charging may be directly supplied to a load 600.

The battery 20 stores the power supplied from the charger 10 or the power source 30 via the power line 8 and supplies the stored power to the load 600 connected to the power line 8.

System power 500 is connected to the power source 30. The power source 30 receives power (particularly, nighttime power at low electric rate) from the system power 500 and charges the battery 20 via the power line 8. Further, in the case where the power supplied from the battery 20 to the load 600 is insufficient, the power of the system power 500 can also be directly supplied to the load 600.

The power storage unit 200 is a monitoring target. Specifically, the charger 10, the battery 20, and the power source 30 related to the power control/supply, which are included in the power storage unit 200, are monitored by the various sensors 1, 2, and 3. The various sensors 1, 2, and 3 each record a value indicating a status of a detected monitoring target (status value) as a log as needed, and supplies the status value to the packet converters 4, 5, and 6, respectively.

The values each indicating the status of the monitoring target, which are detected by the various sensors 1, 2, and 3, are converted in the form of packets (transmission information) by the packet converters 4, 5, and 6 in response to a status acquisition request from the energy management unit 30 and transmitted to the repeaters 40a, 40b, and 40c. It should be noted that the status of the monitoring target used herein is an output voltage value, an output current value, a temperature value, the remaining amount of the storage battery, or the like.

The energy management unit 300 manages and controls the power storage unit 200. Specifically, the energy management unit 300 acquires the values each indicating the status of the monitoring target from the various sensors 1, 2, and 3 via the repeaters 40a, 40b, and 40c and the packet converters 4, 5, and 6. The energy management unit 300 starts and stops power supply in the monitoring target, and switches various modes, for example, on the basis of the acquired values or an instruction from an administrator. Further, the energy management unit 300 passes the received packets to the abnormality detection computation section 50.

The abnormality detection computation section 50 corresponds to the above-mentioned abnormality detection system. The abnormality detection computation section 50 performs computation to detect abnormality of the monitoring target on the basis of an operation data set indicating the status of the monitoring target, which serves as packets passed from the energy management unit 300, and a reference database. Further, in the abnormality detection computation section 50, a sensitivity test is performed on the basis of the packets transmitted for a sensitivity test from the repeaters 40a, 40b, and 40c. It should be noted that details of the abnormality detection computation section 50 will be described later.

The repeater 40a is inserted (installed) on the transmission path 7 connecting the packet converter 4 and the energy management unit 300. The repeater 40b is inserted (installed) on the transmission path 7 connecting the packet converter 5 and the energy management unit 300. The repeater 40c is inserted (installed) on the transmission path 7 connecting the packet converter 6 and the energy management unit 300. The repeaters 40a, 40b, and 40c are installed in the middle of existing transmission paths 7 of a power storage system that does not support the present technology, and thus that power storage system can be easily changed to a system that supports the present technology.

The repeaters 40a, 40b, and 40c receive the packets including the values each indicating the status of the monitoring target, which are transmitted from the packet converters 4, 5, and 6, and transmit the received packets as they are to the energy management unit 300 or process the received packets and then transmit the packets to the energy management unit 300. Further, the repeaters 40a, 40b, and 40c relay and transmit the packets on a control instruction transmitted from the energy management unit 300, and the like as they are to the packet converters 4, 5, and 6.

In the case where a sensitivity test is performed, the repeaters 40a, 40b, and 40c each correct the value indicating the status of the monitoring target in the packets transmitted from the packet converters 4, 5, and 6. Further, the repeaters 40a, 40b, and 40c each generate packets for a sensitivity test by adding a test flag (flag information) indicating that the value has been corrected for the sensitivity test, and transmit the generated packets to the abnormality detection computation section 50 via the energy management unit 300 for the purpose of the sensitivity test. It should be noted that the details of the repeaters 40 will be described later.

It should be noted that the transmission paths 7 may be transmission lines based on the RS-232C (Recommended Standard 232 version C) standard, transmission lines based on the CAN (Controller Area Network) standard, transmission paths by Ethernet (registered trademark) standard, or transmission paths by any other standards.

Hereinabove, the general outline and the entire configuration of the power storage system have been described.

Modified Example 1

Figure 2:
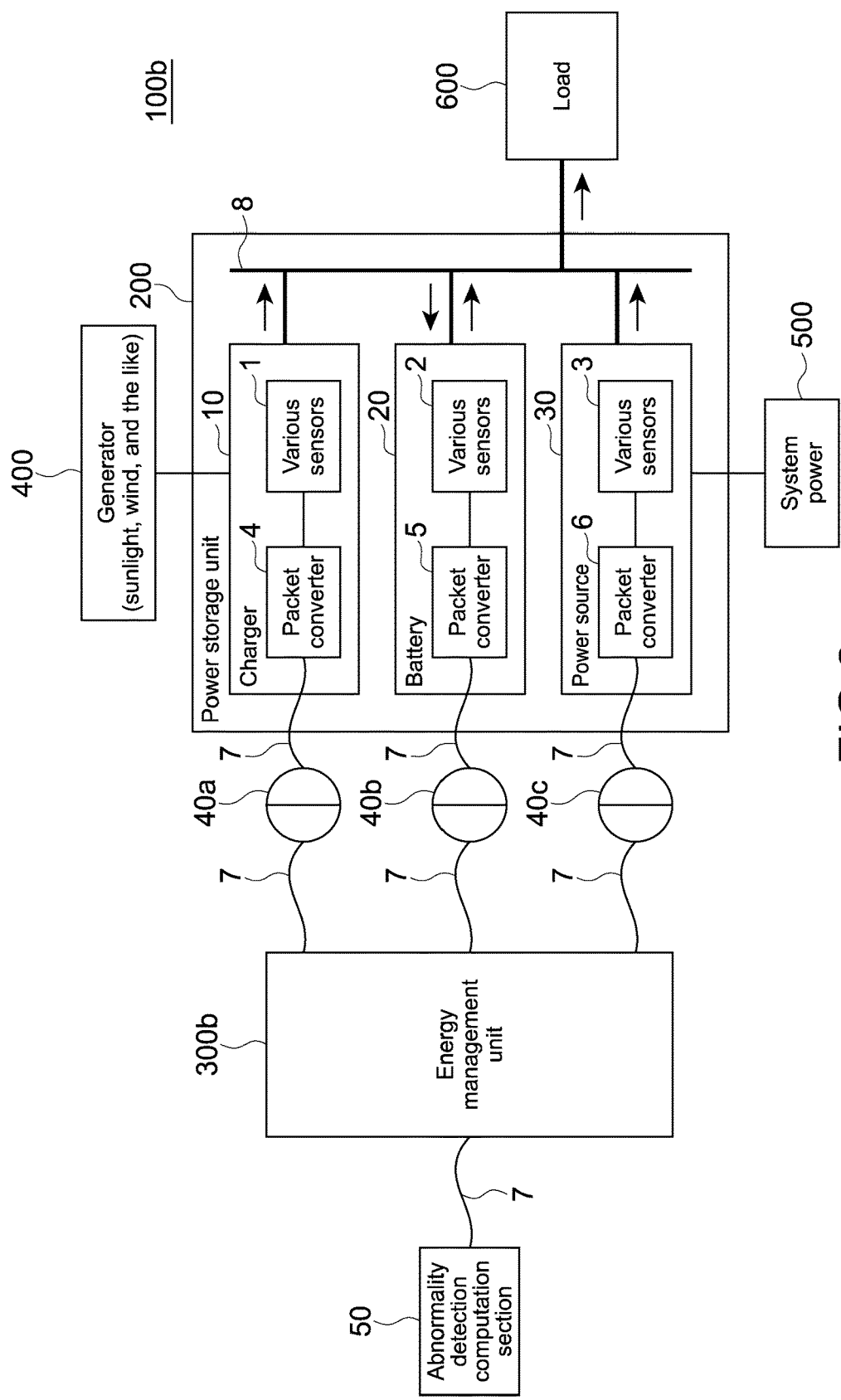
FIG. 2 is a block diagram of a power storage system 100b with a changed configuration.

Here, as one modified example, a power storage system 100b with a changed configuration will be described. FIG. 2 is a block diagram of a power storage system 100b with a changed configuration. In this modified example 1, the abnormality detection computation section 50 is provided outside an energy management unit 300b. The abnormality detection computation section 50 and the energy management unit 300b are connected to each other by the transmission path 7. In this modified example 1, the abnormality detection computation section 50 is provided outside the energy management unit 300b, and thus even a power storage system that does not support the present technology can be easily changed to the power storage system 100b that supports the present technology by adding the abnormality detection computation section 50 thereto.

Modified Example 2

Figure 3:
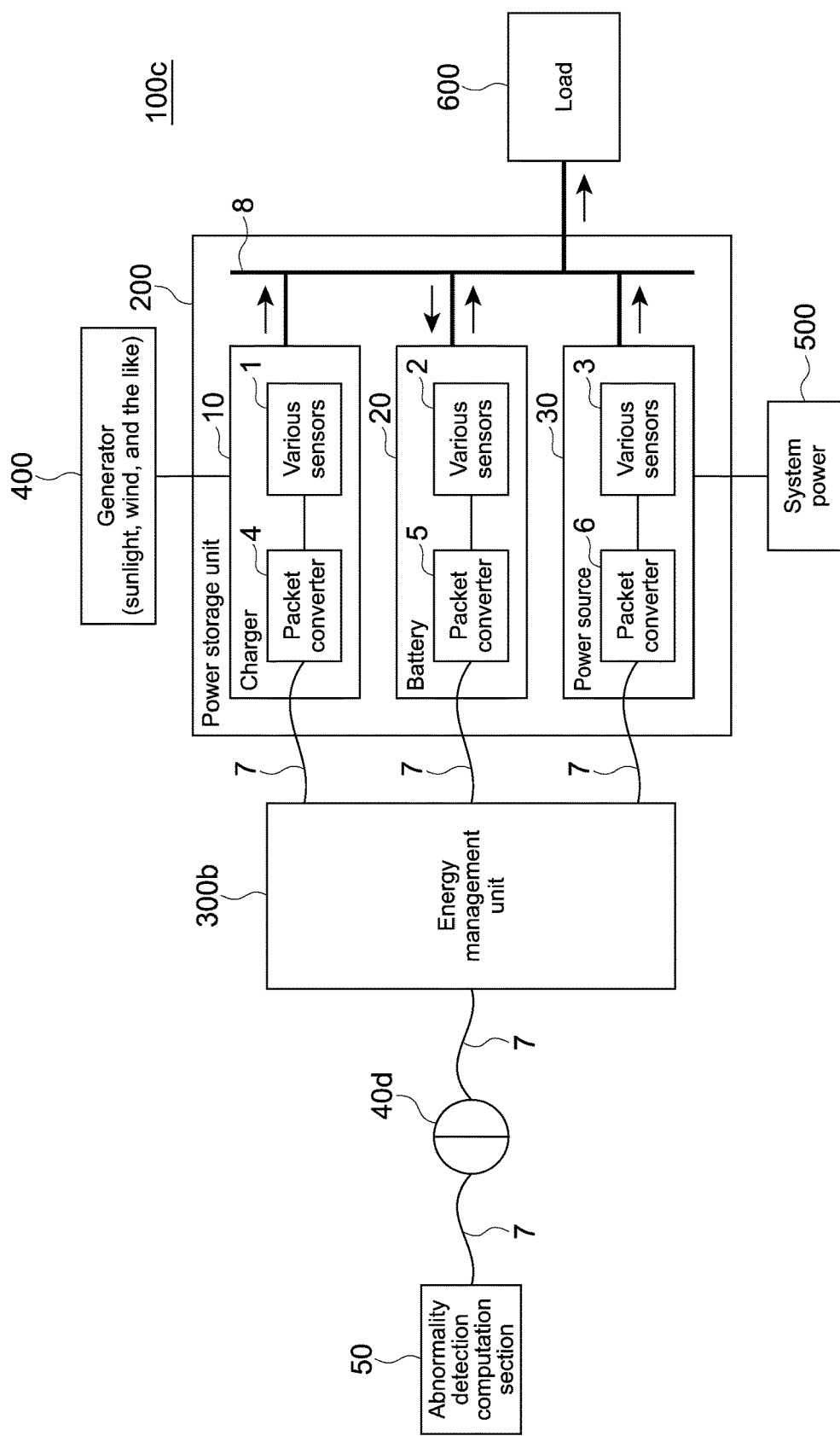
FIG. 3 is a block diagram of a power storage system 100c with a changed configuration.

Next, as another modified example, a power storage system 100c with a further changed configuration will be described. FIG. 3 is a block diagram of a power storage system 100c with a changed configuration. In this modified example 2, the repeaters 40a, 40b, and 40c are not provided between the packet converters 4, 5, and 6 and the energy management unit 300b as in the modified example 1, but a repeater 40d is provided between the energy management unit 300b and the abnormality detection computation section 50. In this modified example 2, the repeater 40d is installed between the energy management unit 300b and the abnormality detection computation section 50 that are connected to each other via only one transmission path 7. Thus, only one repeater 40d enables the present technology to be implemented.

[Repeaters]

Next, the details of the repeaters 40a, 40b, and 40c will be described. It should be noted that the same holds true for the repeater 40d.

Figure 4:
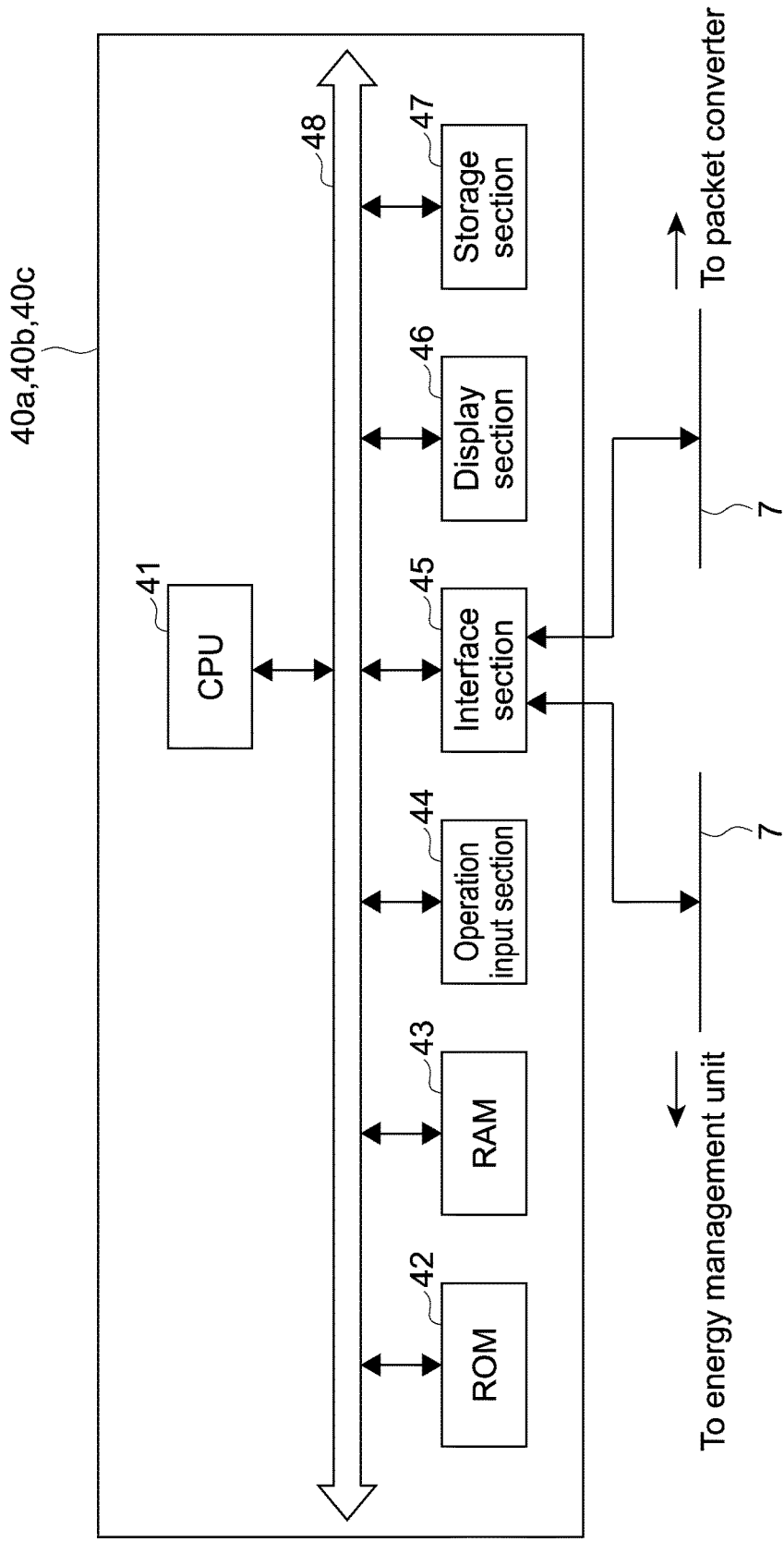
FIG. 4 is a block diagram of a case where repeaters 40a, 40b, and 40c are each constituted by a general PC.

Each of the repeaters 40a, 40b, and 40c may be constituted by dedicated hardware or software or may be constituted by a general PC (Personal Computer). FIG. 4 shows a block diagram of a case where the repeaters 40a, 40b, and 40c are each constituted by a general PC.

As shown in the figure, the repeaters 40a, 40b, and 40c each include a CPU (Central Processing Unit) (first control section) 41, a ROM (Read Only Memory) 42, a RAM (Random Access Memory) 43, an operation input section 44, an interface section 45, a display section 46, and a storage section 47, and those blocks are connected to one another via a bus 48.

The ROM 42 fixedly stores a plurality of programs such as firmware for executing various types of processing, and data. The RAM 43 is used as a work area of the CPU 41 and temporarily stores an OS (Operating System), various applications in execution, or various types of data in processing. In this embodiment, in the case where the repeaters 40a, 40b, and 40c correct the packets, the received packets are temporarily stored in the RAM 43, and a value indicating the status of the monitoring target, which is shown by the content of the packets, is changed as necessary.

The storage section 47 is a non-volatile memory such as an HDD (Hard Disk Drive), a flash memory, or any other solid-state memory. The storage section 47 stores the OS, various applications, and various types of data.

The interface section 45 is connected to the transmission paths 7 that transmit the packets, and receives the packets transmitted from each of the packet converters 4, 5, and 6. Further, the interface section 45 transmits the packets once received in each of the repeaters 40a, 40b, and 40c to the energy management unit 300.

The CPU 41 develops a program, which corresponds to a command given from the operation input section 44 out of a plurality of programs stored in the ROM 42 or the storage section 47, on the RAM 43, and appropriately controls the display section 46 and the storage section 47 according to the developed program.

The operation input section 44 is, for example, a pointing device such as a mouse, a keyboard, a touch panel, or any other operating device.

The display section 46 is, for example, a liquid crystal display, an EL (Electro-Luminescence) display, a plasma display, or a CRT (Cathode Ray Tube) display. The display section 46 may be incorporated in each of the repeaters 40a, 40b, and 40c or may be externally connected thereto.

Hereinabove, the configuration of the repeaters 40a, 40b, and 40c has been described. Next, description will be given on a main function of the repeaters 40a, 40b, and 40c, i.e., generation of a test packet by correcting a value in the packet when a sensitivity test is performed.

Figure 5:
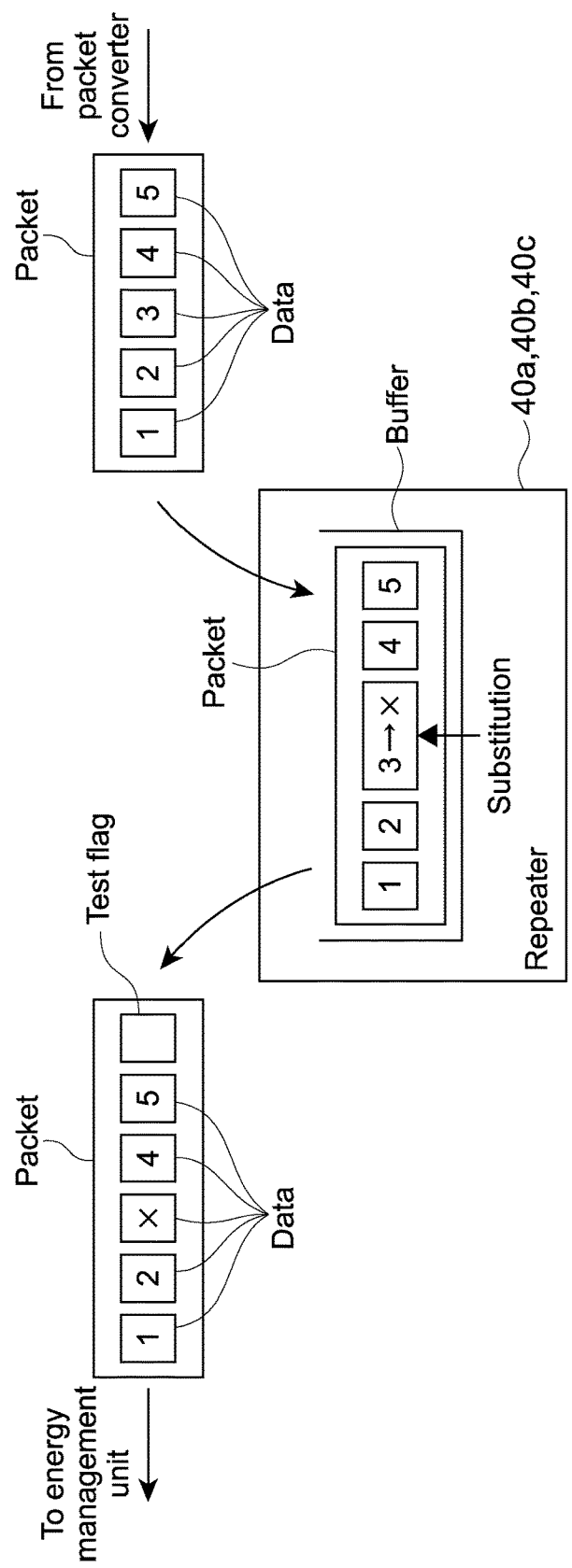
FIG. 5 is a diagram showing a state where the repeaters 40a, 40b, and 40c each correct the content of a received packet, when a sensitivity test is performed.

FIG. 5 is a diagram showing a state where the repeaters 40a, 40b, and 40c each correct the content of a received packet, when a sensitivity test is performed.

When an instruction to execute a sensitivity test is given, first, the repeaters 40a, 40b, and 40c temporarily store packets received via the transmission paths 7 from the packet converters 4, 5, and 6, respectively, in respective buffers provided on the RAM 43. It should be noted that the instruction for a sensitivity test may be given by an administrator of the power storage system 100 that performs a sensitivity test or by a sensitivity test execution unit (described later) that is constituted by a computer or the like and automatically executes a sensitivity test.

Next, the repeaters 40a, 40b, and 40c understand the content of the stored packets, that is, values included in the packets and each indicating a status of the monitoring target, and then corrects the values. The correction of values is performed along a policy that will be described later. It should be noted that in the figure, the content of the third data in a packet is rewritten from "3" to "X".

Next, the repeaters 40a, 40b, and 40c each add a test flag to the packet in which the content is rewritten in the buffer. Next, the repeaters 40a, 40b, and 40c each transmit the packet, which is rewritten and provided with the test flag, to the abnormality detection computation section 50 through the energy management unit 300 via the transmission paths 7.

In the repeaters 40a, 40b, and 40c, a test flag is set for a test packet to be transmitted, such that the abnormality detection computation section 50 can distinguish between the packets in a normal operation and those in a sensitivity test. Therefore, with use of the repeaters 40a, 40b, and 40c of the present technology, a sensitivity test can be performed during an actual operation of the power storage system 100.

(Policy to Correct Value Indicating Status of Monitoring Target)

Next, in order to generate the packet received by each of the repeaters 40a, 40b, and 40c as a test packet, a policy to correct a value in the packet will be described.

A test packet generated in each of the repeaters 40a, 40b, and 40c is generated to test whether a reference database used for abnormality detection by the abnormality detection computation section 50 has an appropriate abnormality detection sensitivity in the power storage system 100. Therefore, it is not appropriate to use, as a test packet value, an abnormal value distinctly straying from the specifications of one monitoring target.

For example, it is not appropriate to set an abnormal value as in the case where a value detected by the sensor is set to 150 V irrespective of the fact that the output voltage value of the battery 20 is in the range from 95 V to 105 V in the specifications. When such an abnormal value is used, in the abnormality detection computation section 50, a numerical value indicating incompatibility of the operation data set is increased and is naturally determined to be abnormal, and thus it goes against an object of the sensitivity test.

In this regard, for a policy when the value indicating the status of the monitoring target is corrected, the value indicating the status of the monitoring target, which is included in the received packet, is corrected by addition of a "minute change" thereto. In other words, by using a borderline value that is determined to be abnormal, a sensitivity test can be appropriately performed.

In the "minute change", for example, in the case of the output voltage value of the battery 20 described above, in the case where the output voltage value is 100 V, for example, approximately 1 V that is 1% thereof is an appropriate value. By adding this 1 V to the original value or reducing this 1 V, an abnormal value for a test is generated. It should be noted that a value actually used as the value of "minute change" is individually set depending on the types of the value indicating the status of the monitoring target, for example, a voltage value, a current value, and a temperature value. It should be noted that the value of the "minute change" may be given as a fixed value or may be given by calculation using a computing equation, such as obtaining X % of an actually determined value.

The repeaters 40a, 40b, and 40c each add the "minute change" to the actually determined value to generate an abnormal value, and transmit the abnormal value to the abnormality detection computation section 50. The abnormality detection computation section 50 sets the abnormal value as an operation data set to obtain a numerical value indicating incompatibility (evaluate incompatibility), and determines whether an event indicating the set abnormal value is abnormal or not.

Hereinabove, the function of generating the test packet, which is provided to the repeaters 40a, 40b, and 40c, will be described.

[Abnormality Detection Computation Section 50]

Next, details of the abnormality detection computation section 50 will be described. The abnormality detection computation section 50 may be constituted by dedicated hardware or software or may be constituted by a general PC. The configuration of a general PC is similar to that used for describing the repeaters 40a, 40b, and 40c, and thus description thereof will be omitted.

Figure 6:
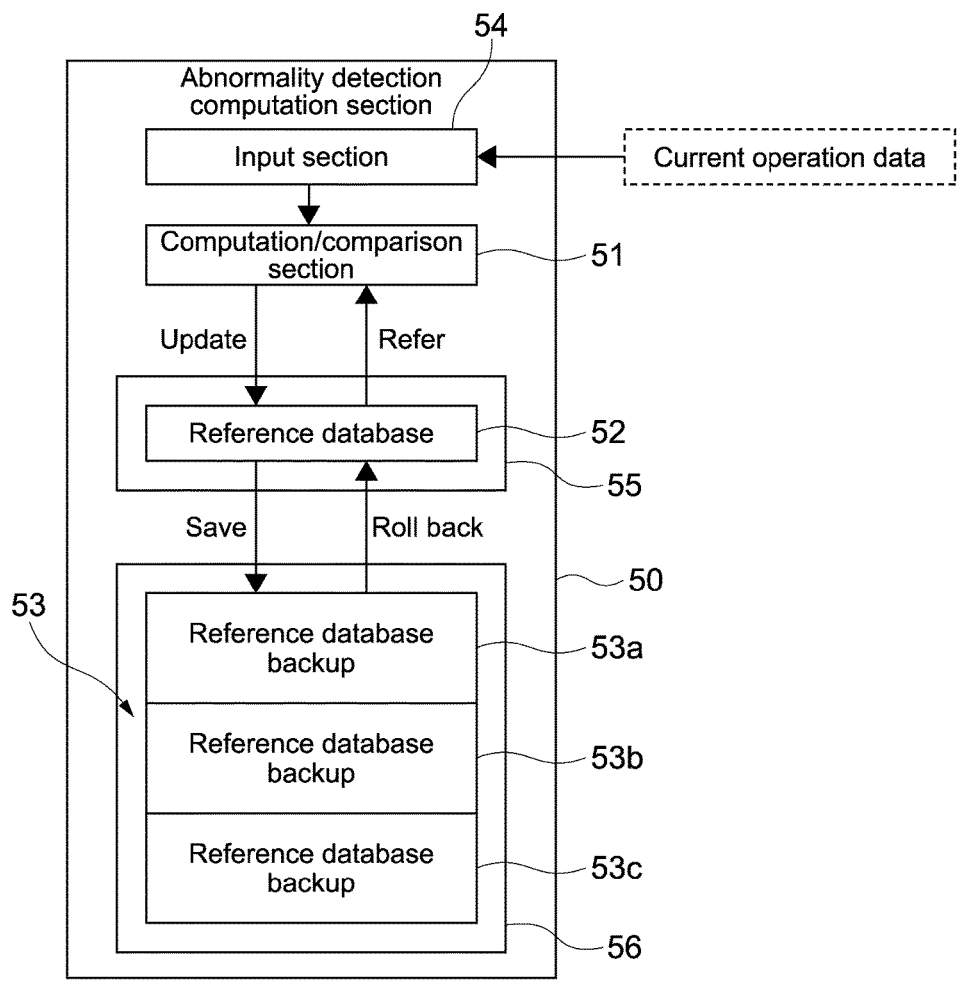
FIG. 6 is a functional block diagram of an abnormality detection computation section 50.

Next, a functional block of the abnormality detection computation section 50 will be described. FIG. 6 is a functional block diagram of the abnormality detection computation section 50.

The abnormality detection computation section 50 includes an input section 54, a computation/comparison section (abnormality detection section) 51, a first storage section (storage section) 55 that stores a reference database (reference data set) 52, and a second storage section 56 that stores a backup 53 of the reference database.

The input section 54 receives the packets transmitted from the repeaters 40a, 40b, and 40c through the energy management unit 300. The input section 54 passes a current operation data set, which includes the value indicating the status of the monitoring target in the received packets, to the computation/comparison section 51.

The computation/comparison section 51 computes a normal space indicated by the reference database 52 and a current operation data set by the pattern recognition technology (multivariate analysis). The computation/comparison section 51 then detects abnormality on the basis of the magnitude of the numerical value indicating incompatibility that is obtained as a result of the computation.

The reference database 52 is an aggregate of elements for defining the range of a normal space used for abnormality detection. The reference database 52 is updated by a new operation data set.

The backup 53 of the reference database is an aggregate of backups of the reference database obtained before being updated, the backups being made when the reference database 52 is updated. In the figure, it is found that three backups 53a, 53b, and 53c are present and the update of the reference database 52 was made three times in the past. It should be noted that in the configuration of this figure, the backup 53 of the reference database is stored in the second storage section 56 within the abnormality detection computation section 50, but is not limited to this configuration. The backup 53 of the reference database may be configured to be saved outside the abnormality detection computation section 50.

When an instruction to start a sensitivity test is given, the abnormality detection computation section 50 receives a packet having a test flag and performs abnormality detection computation by using the value indicating the status of the monitoring target, which is included in the packet. It should be noted that the instruction for a sensitivity test may be given by an administrator of the power storage system 100 that performs a sensitivity test or by a sensitivity test execution unit that is constituted by a computer or the like and automatically executes a sensitivity test.

If the numerical value indicating incompatibility, which is obtained as a result of the abnormality detection computation, does not satisfy an appropriate condition by comparison with a predetermined reference value, the reference database 52 is rolled back by use of the saved past backup 53. With this rollback, the range of the normal space indicated by the reference database 52 is returned to the previous one. Thus, the sensitivity of the abnormality detection can be kept the same as before.

Hereinabove, the details of the abnormality detection computation section 50 have been described.

[Conclusion of Configuration of Power Storage System]

It should be noted that regarding the configuration of the power storage system 100, from a different perspective, the power storage system 100 includes the battery 20, the charger 10 that charges the battery 20, and the power source 30, and from a plurality of perspectives, the power storage system 100 includes the power storage unit 200 and the abnormality detection computation section 50, the power storage unit 200 including the various sensors 1, 2, and 3 that detect at least one status of the battery 20, the charger 10, and the power source 30, the abnormality detection computation section 50 including the input section 54 that acquires transmission information including a plurality of detected status values from the power storage unit 200 via a transmission path, and the computation/comparison section 51 that detects abnormality of the power storage unit 200 by a multivariate analysis for the plurality of acquired status values.

[Processing Flow]

Next, a processing flow on the power storage system 100 will be described. First, a processing flow from when the power storage system 100 is newly installed to when the power storage system 100 is normally operated will be described. Next, description will be given on a processing flow of the update of the reference database 52 and a sensitivity test, when an operation data set to update the reference database 52 is obtained in a normal operation.

(Flow from Installation of Power Storage System to Normal Operation)

Figure 7:
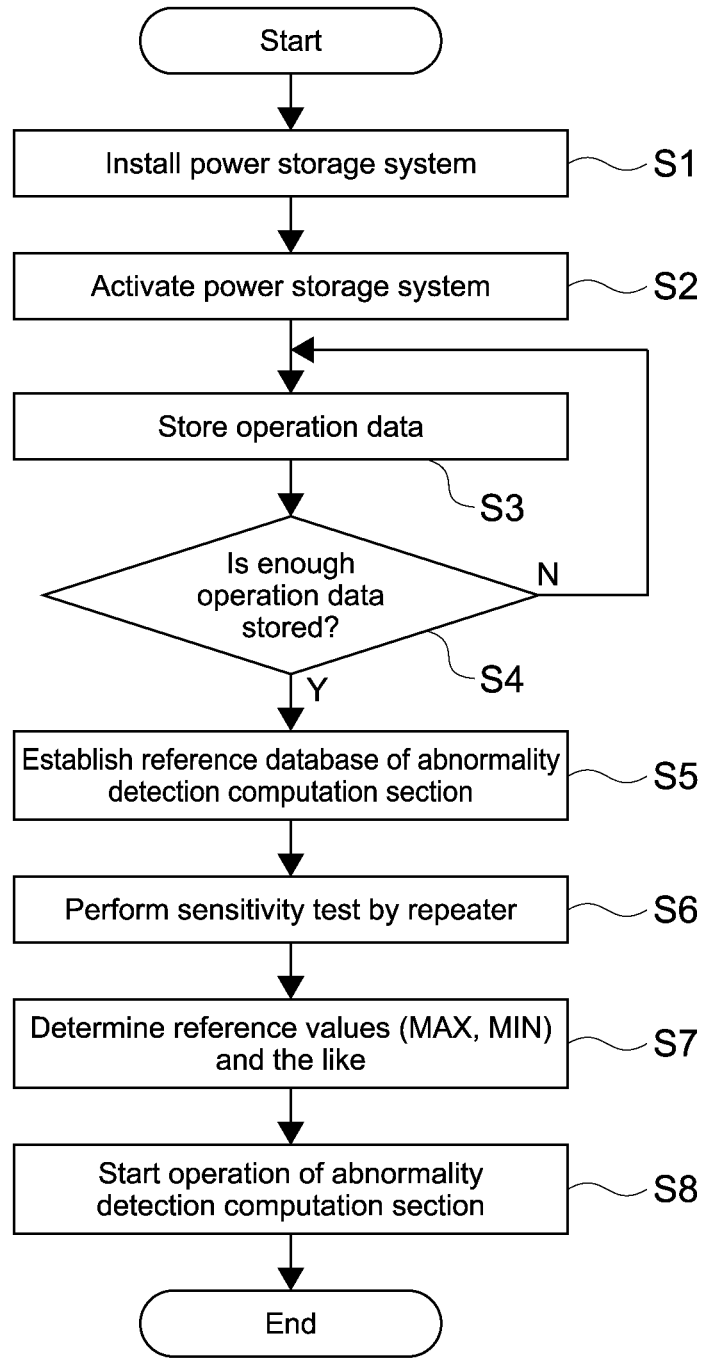
FIG. 7 is a flowchart for describing a flow from installation of a power storage system 100 to a normal operation.

First, a flow from the installation of the power storage system 100 to a normal operation will be described. FIG. 7 is a flowchart for describing a flow from the installation of the power storage system 100 to a normal operation.

First, an administrator installs the power storage system 100 (Step S1).

Next, the administrator activates the power storage system 100 (Step S2).

Next, the administrator causes the power storage system 100 to store operation data (operation data set) so as to establish the reference database 52 (Step S3).

Next, the administrator determines whether enough operation data to establish the reference database 52 is stored or not (Step S4).

In the case where enough operation data is not yet stored (N of Step S4), the processing is returned to Step S3, so that the operation data is continued to be stored.

In the case where enough operation data is stored (Y of Step S4), next, the abnormality detection computation section 50 establishes the reference database 52 on the basis of the stored operation data set (Step S5).

Next, the administrator or the sensitivity test execution unit performs a sensitivity test by using the repeaters 40a, 40b, and 40c (Step S6).

Next, the administrator or the sensitivity test execution unit determines a maximum reference value (MAX) and a minimum reference value (MIN), which are compared with a numerical value A indicating incompatibility (Step S7).

Next, the administrator starts operation of the abnormality detection system, that is, the abnormality detection computation section 50 (Step S8).

Hereinabove, the flow from the installation of the power storage system 100 to a normal operation has been described.

(Processing Flow of Update of Reference Database and Sensitivity Test)

Figure 8:
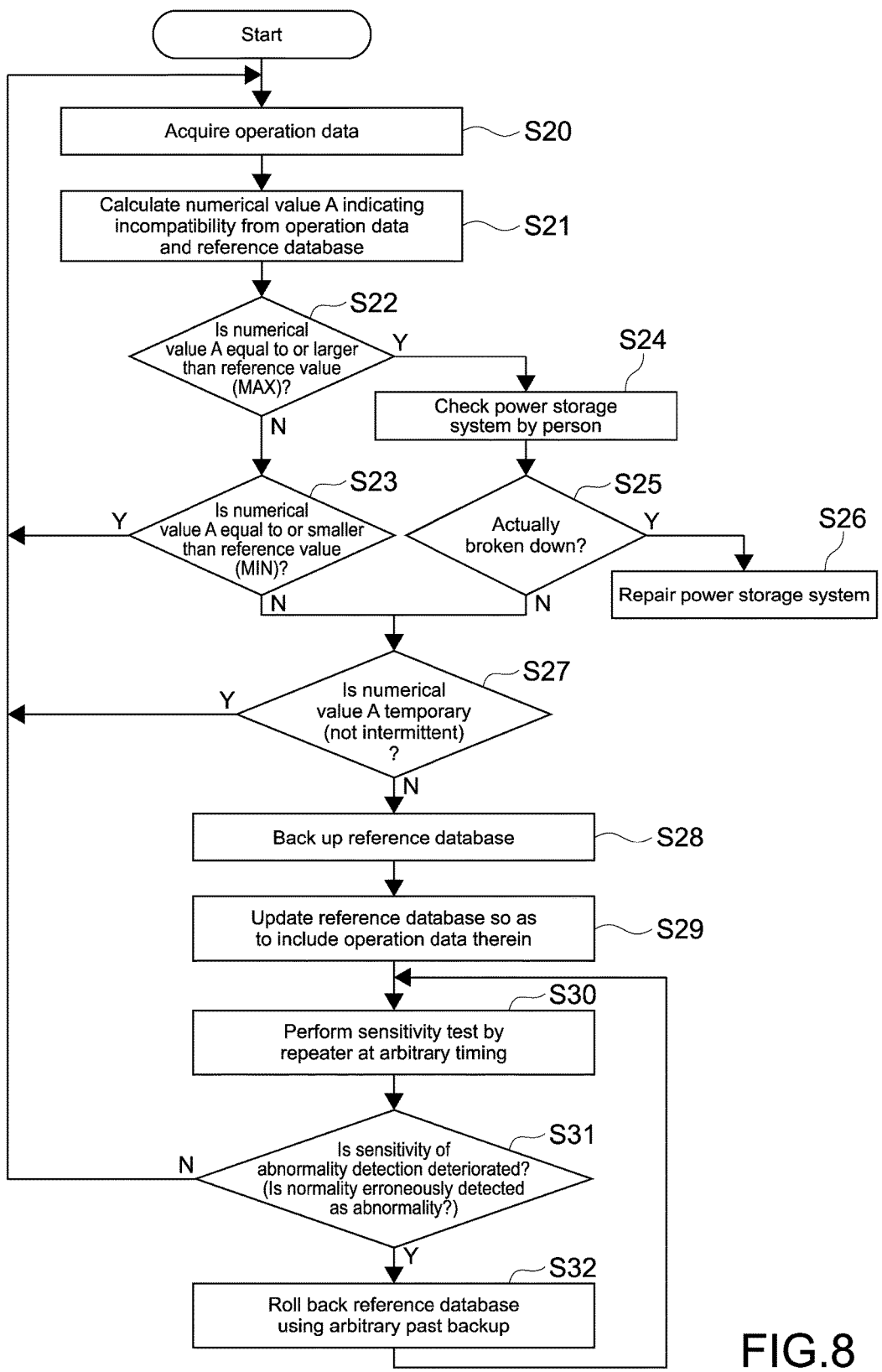
FIG. 8 is a flowchart for describing a processing flow when a reference database 52 is updated after the power storage system 100 is normally activated, or a sensitivity test is performed after the reference database 52 is updated.

Next, description will be given on a processing flow when the reference database 52 is updated after the power storage system 100 is normally activated, or a sensitivity test is performed after the reference database 52 is updated. FIG. 8 is a flowchart for describing a processing flow when the reference database 52 is updated after the power storage system 100 is normally activated, or a sensitivity test is performed after the reference database 52 is updated.

First, the abnormality detection computation section 50 receives a packet (packet in practical use) including the value indicating the status of the monitoring target, to acquire operation data (Step S20).

Next, the abnormality detection computation section 50 performs pattern recognition computation by a multivariate analysis on the basis of an operation data set including the operation data acquired in Step 20 and the reference database 52, and calculates a numerical value A indicating incompatibility (Step S21).

Next, the abnormality detection computation section 50 determines whether the numerical value A is equal to or larger than a predetermined maximum reference value (MAX) (Step S22).

In the case where the numerical value A is smaller than the maximum reference value (MAX) (N of Step S22), next, the abnormality detection computation section 50 determines whether the numerical value A is equal to or smaller than a predetermined minimum reference value (MIN) (Step S23).

In the case where the numerical value A is equal to or smaller than the minimum reference value (MIN) (Y of Step S23), the abnormality detection computation section 50 returns the processing to Step S20 and repeats the abnormality detection processing of the monitoring target.

In Step S22, in the case where the numerical value A is equal to or larger than the maximum reference value (MAX) (Y of Step S22), if the test flag is not set, the abnormality detection computation section 50 activates an alarm, and the administrator checks the power storage system 100 (Step S24).

Next, the administrator determines whether the power storage system 100 is actually broken down or not (Step S25).

In the case where the power storage system 100 is actually broken down (Y of Step S25), the administrator repairs the power storage system 100 (Step S26). After the power storage system 100 is repaired and returned to a normal operation, the processing can be resumed from Step S20.

In Step S23, in the case where the numerical value A exceeds the minimum reference value (MIN) (N of Step S23), and in Step S25, in the case where the power storage system is not broken down (N of Step S25), next, the abnormality detection computation section 50 determines whether the occurrence of the numerical value A is temporary (not intermittent) or not (Step S27).

In the case where the numerical value A is determined to be temporary (Y of Step S27), the abnormality detection computation section 50 returns the processing to Step S20 and repeats the abnormality detection processing of the monitoring target.

In the case where the numerical value A is not determined to be temporary (N of Step S27), the abnormality detection computation section 50 proceeds to update processing of the reference database 52.

In the update processing, first, the abnormality detection computation section 50 backs up the current reference database 52 (Step S28).

Next, the abnormality detection computation section 50 updates the reference database 52 so as to include the operation data set serving as a trigger of the update processing of this time (Step S29).

Next, by the instruction given at an arbitrary timing, a sensitivity test is performed by using the repeaters 40a, 40b, and 40c (Step S30). It should be noted that the instruction may be given by the administrator of the power storage system 100 that performs a sensitivity test or by the sensitivity test execution unit that is constituted by a computer or the like and automatically executes a sensitivity test.

Next, the administrator or the sensitivity test execution unit determines whether the sensitivity of the abnormality detection is deteriorated or not (whether normality or abnormality on a generated event is erroneously detected) on the basis of a result of the sensitivity test (Step S31).

In the case where the sensitivity of the abnormality detection is not deteriorated (N of Step S31), the administrator or the sensitivity test execution unit returns the processing to Step S20 and causes the abnormality detection computation section 50 to continue the abnormality detection processing of the monitoring target.

In the case where the sensitivity of the abnormality detection is deteriorated (Y of Step S31), next, the administrator or the sensitivity test execution unit instructs the abnormality detection computation section 50 to roll the reference database 52 back to a past time point by using an arbitrary past backup (Step S32).

After the rollback, the administrator or the sensitivity test execution unit returns the processing to Step S30 and performs a sensitivity test again. In the sensitivity test at that time, since the reference database at a past time point at which the sensitivity of the abnormality detection is not deteriorated is used, it is determined in the next Step S31 that the sensitivity of the abnormality detection is not deteriorated. The administrator or the sensitivity test execution unit returns the processing to Step S20 to continue the normal operation.

Hereinabove, description has been given on the processing flow when the reference database 52 is updated after the power storage system 100 is normally activated, or the sensitivity test is performed after the reference database 52 is updated.

Modified Example 3

Figure 9:
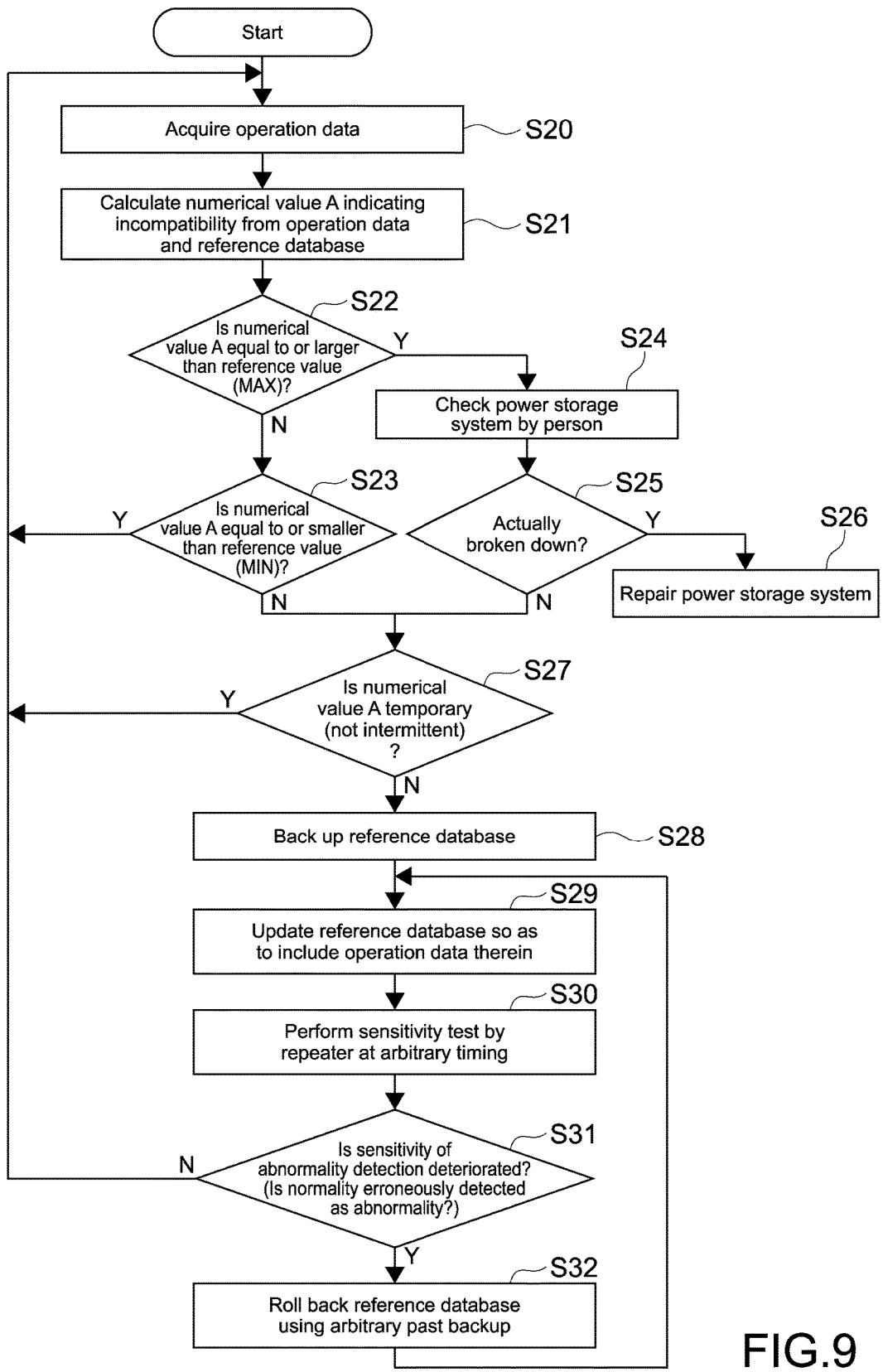
FIG. 9 is a flowchart for describing a modified example of processing on the update of the reference database 52 and on the sensitivity test after the update.

Here, a modified example of processing on the update of the reference database 52 and a sensitivity test after the update will be described. FIG. 9 is a flowchart for describing a modified example of processing on the update of the reference database 52 and a sensitivity test after the update.

The processing flow described above and the processing flow in this modified example 3 are different from each other in that, after the reference database 52 is rolled back in Step S32, the processing is returned to Step S29 in this modified example, to update the reference database 52 so as to include the operation data set serving as a trigger of the update processing of this time.

This enables the operation data set obtained this time to be reflected on the reference database and effectively used without being discarded.

In the case where the configuration of this modified example is adopted, it is predicted that there is a backup in which the sensitivity of the abnormality detection is not deteriorated even if the operation data set obtained this time is reflected. In this modified example, the operation data set obtained this time is reflected on the rolled-back reference database, and a sensitivity test is then performed. So, if there is no backup having a sufficiently narrow normal space, the power storage system 100 cannot be returned to a normal operation. In order to return the power storage system 100 to a normal operation in the case where there is no appropriate backup, the reference database 52 does not have to be updated after the rollback.

Hereinabove, the modified example of the processing on the update of the reference database 52 and the sensitivity test after the update has been described.

Modified Example 4

Figure 10:
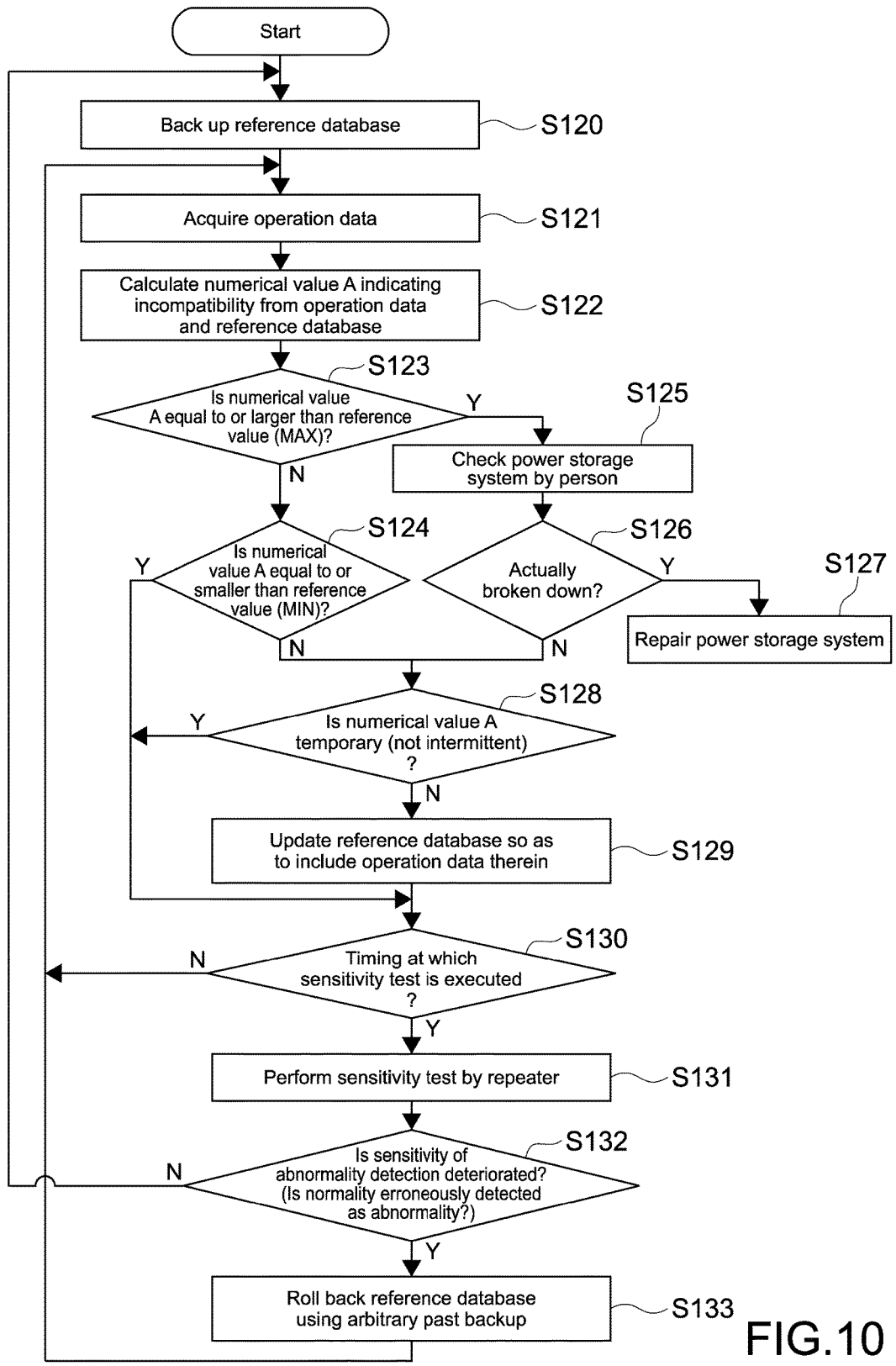
FIG. 10 is a flowchart for describing a modified example of processing on a backup of the reference database 52, the update of the reference database 52, and the sensitivity test after the update.

Here, a modified example of processing on the backup of the reference database 52, the update of the reference database 52, and the sensitivity test after the update will be described. FIG. 10 is a flowchart for describing a modified example of processing on the backup of the reference database 52, the update of the reference database 52, and the sensitivity test after the update. In this modified example, a timing at which the reference database 52 is backed up is different from the processing flow described above.

First, the abnormality detection computation section 50 backs up the current reference database 52 (Step S120).

Next, the abnormality detection computation section 50 receives a packet (packet in practical use) including the value indicating the status of the monitoring target, to acquire operation data (Step S121).

Next, the abnormality detection computation section 50 performs pattern recognition computation by a multivariate analysis on the basis of an operation data set including the operation data acquired in Step S120 and the reference database 52, and calculates a numerical value A indicating incompatibility (Step S122).

Next, the abnormality detection computation section 50 determines whether the numerical value A is equal to or larger than a predetermined maximum reference value (MAX) (Step S123).

In the case where the numerical value A is smaller than the maximum reference value (MAX) (N of Step S123), next, the abnormality detection computation section 50 determines whether the numerical value A is equal to or smaller than a predetermined minimum reference value (MIN) (Step S124).

In the case where the numerical value A is equal to or smaller than the minimum reference value (MIN) (Y of Step S124), the processing proceeds to determination on whether to execute a sensitivity test of the reference database 52.

In Step S123, in the case where the numerical value A is equal to or larger than the maximum reference value (MAX) (Y of Step S123), if the test flag is not set, the abnormality detection computation section 50 activates an alarm, and the administrator checks the power storage system 100 (Step S125).

Next, the administrator determines whether the power storage system 100 is broken down or not (Step S126).

In the case where the power storage system 100 is actually broken down (Y of Step S126), the administrator repairs the power storage system 100 (Step S127). After the power storage system 100 is repaired and returned to a normal operation, the processing can be resumed from Step S121.

In Step S124, in the case where the numerical value A exceeds the minimum reference value (MIN) (N of Step S124), and in Step S126, in the case where the power storage system is not broken down (N of Step S126), next, the abnormality detection computation section 50 determines whether the occurrence of the numerical value A is temporary (not intermittent) or not (Step S128).

In the case where the numerical value A is determined to be temporary (Y of Step S128), the processing proceeds to determination on whether to execute a sensitivity test of the reference database 52.

In the case where the numerical value A is not determined to be temporary (N of Step S128), the abnormality detection computation section 50 updates the reference database 52 so as to include the operation data set obtained this time (Step S129), and proceeds to determination on whether to execute a sensitivity test of the reference database 52.

In the case where the numerical value A is equal to or smaller than the minimum reference value (MIN) in Step S124 (Y of Step S124), in the case where the occurrence of the numerical value A is temporary in Step S128 (Y of Step S128), and after the reference database 52 is updated in Step S129, the sensitivity test execution unit or the administrator determines a timing at which a sensitivity test is executed (Step S130). An instruction for the sensitivity test may be given at an arbitrary timing by the administrator of the power storage system 100 that performs a sensitivity test or by the sensitivity test execution unit that is constituted by a computer or the like and automatically executes a sensitivity test.

In the case where a timing at which a sensitivity test is executed is not determined (N of Step S130), the abnormality detection computation section 50 returns the processing to Step S121 and repeats the abnormality detection processing of the monitoring target.

In the case where a timing at which the sensitivity test is executed is determined (Y of Step S130), the administrator or the sensitivity test execution unit performs a sensitivity test of the current (latest) reference database 52 by using the repeaters 40*a*, 40*b*, and 40*c* (Step S131).

Next, the administrator or the sensitivity test execution unit determines whether the sensitivity of the abnormality detection is deteriorated or not (whether normality or abnormality on a generated event is erroneously detected) on the basis of a result of the sensitivity test (Step S132).

In the case where the sensitivity of the abnormality detection is not deteriorated (N of Step S132), the abnormality detection computation section 50 returns the processing to Step S120 and backs up the current (latest) reference database 52.

In the case where the sensitivity of the abnormality detection is deteriorated (Y of Step S132), the administrator or the sensitivity test execution unit instructs the abnormality detection computation section 50 to roll the reference database 52 back to a past time point by using an arbitrary past backup (Step S133).

After the rollback, since the reference database 52 used for abnormality detection is a reference database at a past time point at which the sensitivity of the abnormality detection is not deteriorated, the processing returns to Step S121 to continue the normal operation.

Hereinabove, the modified example of the processing on the backup of the reference database 52, the update of the reference database 52, and the sensitivity test after the update has been described.

[Sensitivity Test Execution Unit]

Figure 11:
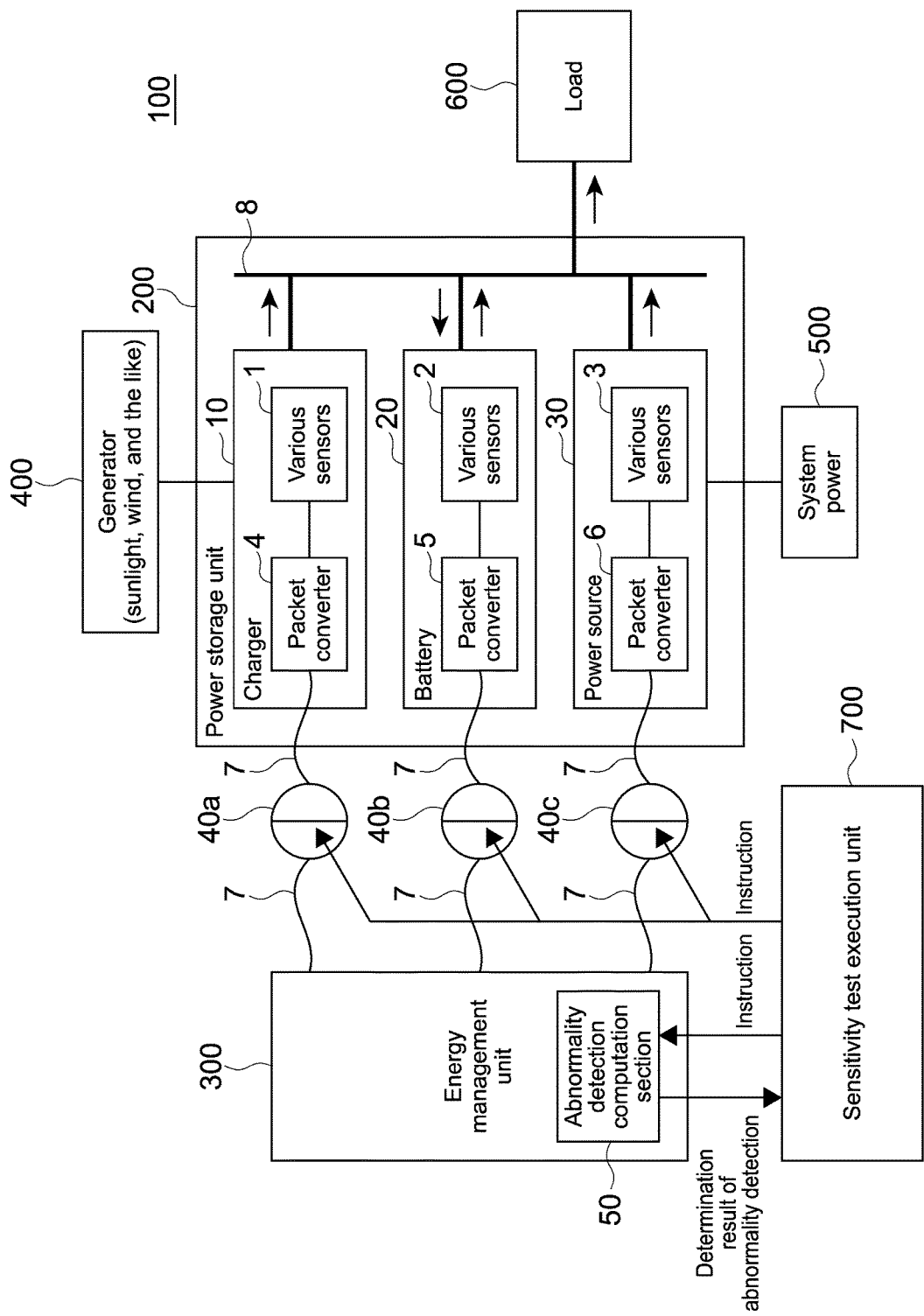
FIG. 11 is a block diagram showing the position of a sensitivity test execution unit 700.

Here, brief description will be given on the sensitivity test execution unit described above. FIG. 11 is a block diagram showing the position of a sensitivity test execution unit 700. It should be noted that the sensitivity test execution unit 700 may be constituted as a part of the power storage system 100.

As shown in the figure, the sensitivity test execution unit 700 is connected to both of the repeaters 40*a*, 40*b*, and 40*c* and the abnormality detection computation section 50 and controls those devices. A control section (second control section) of the sensitivity test execution unit 700 checks whether the sensitivity of the abnormality detection of the abnormality detection computation section 50 is kept or not, at an arbitrary timing or a timing at which the reference database 52 is updated, by executing the sensitivity test. The control section of the sensitivity test execution unit 700 then causes the abnormality detection computation section 50 to roll back the reference database 52 on the basis of the result of the sensitivity test, or in the case of the modified example 3, to update the rolled-back reference database 52. The sensitivity test execution unit 700 can be constituted by using a general PC.

It should be noted that the details of operations of the sensitivity test execution unit 700 have been described in the description on the processing flow, and thus description thereof will be omitted.

[Effects]

Next, among effects obtained by the present technology, some representative ones will be described.

(1) A test packet is generated by using the repeaters 40*a*, 40*b*, and 40*c*, and thus an abnormal event, which occurs extremely less frequently in an actual operation, is caused to occur, and the behavior of the abnormality detection computation section 50 to that event can be verified.

(2) A normal packet and a test packet are distinguished by a test flag, and thus a sensitivity test for the current abnormality detection sensitivity can be performed while the power storage system 100 or the abnormality detection computation section 50 is caused to be normally operated. In other words, in the case where an abnormal value is detected by the test packet, it is possible to refrain from updating the reference database or suppress activation of an alarm of abnormality detection.

(3) With a received value representing an actual status of a monitoring target as a base, the repeaters 40*a*, 40*b*, and 40*c* add "minute change" to that value, to generate an abnormal value. Thus, an abnormal value in accordance with an object of the sensitivity test can be generated.

(4) With a received value representing an actual status of a monitoring target as a base, the repeaters 40*a*, 40*b*, and 40*c* use a predetermined computation equation when "minute change" is added to that value. Thus, an optimal abnormal value can be generated irrespective of the received value.

(5) The reference database is backed up when the reference database is updated. Thus, the reference database can be rolled back to various past time points by using backups as necessary.

(6) The present technology can be applied by merely adding the repeaters 40a, 40b, and 40c to an existing power storage system newly and substituting the abnormality detection computation section 50 corresponding to the present technology for an existing abnormality detection computation section. Thus, investment to the present technology can be suppressed to the minimum.

[Supplementary Note]

In addition, the present technology is not limited to the embodiment described above and can be variously modified without departing from the gist of the present technology as a matter of course.

[Another Configuration of the Present Technology]

It should be noted that the present technology can have the following configurations.

(1) A power storage system, including:
a power storage unit including
a storage battery,
a charging section that charges the storage battery, and
a detection section that detects at least one status of the storage battery and the charging section from a plurality of perspectives; and
an abnormality detection unit including
an input section that acquires transmission information from the power storage unit via a transmission path, the transmission information including a plurality of detected status values, and
an abnormality detection section that detects abnormality of the power storage unit by a multivariate analysis performed on the plurality of acquired status values.

(2) The power storage system according to (1), in which the abnormality detection unit further includes a first storage section that stores a reference data set defining a normal state of the power storage unit by the plurality of status values, and
the abnormality detection section of the abnormality detection unit is configured to
evaluate incompatibility between the plurality of acquired status values and the stored reference data set, and
update the reference database on the basis of an evaluation result.

(3) The power storage system according to (1) or (2), further including a repeater unit including a first control section, the first control section
being provided on the transmission path connecting the power storage unit and the abnormality detection unit,
receiving the transmission information transmitted from the detection section,
changing the status value on the basis of the status value included in the received transmission information, and
transmitting the transmission information including the changed status value to the input section.

(4) The power storage system according to (3), in which the first control section of the repeater unit is configured to add flag information to the transmitted transmission information, the flag information indicating that the status value has been changed.

(5) The power storage system according to (3) or (4), in which
the abnormality detection unit further includes a second storage section that stores a backup of the reference data set, and
the power storage system further includes a sensitivity test execution unit including a second control section, the second control section
causing the first control section of the repeater unit to transmit the transmission information changed for a test to the input section,
causing the abnormality detection section of the abnormality detection unit to determine whether the power storage unit is abnormal or not on the basis of the received transmission information for a test, and
in any of a case where the status value by which the power storage unit is determined to be abnormal is set in the received transmission information for a test, and the abnormality detection unit determines that the power storage unit is normal, and a case where the status value by which the power storage unit is determined to be normal is set in the received transmission information for a test, and the abnormality detection unit determines that the power storage unit is abnormal, causing the abnormality detection section of the abnormality detection unit to write the backup stored in the second storage section back to the reference data set stored in the first storage section.

(6) The power storage system according to (5), in which the second control section of the sensitivity test execution unit is configured to cause the abnormality detection section of the abnormality detection unit to update the reference data set stored in the first storage section, the reference data set being written back by the backup, on the basis of the transmission information lastly received at an actual operation.

DESCRIPTION OF SYMBOLS 1 to 3 various sensors
4 to 6 packet converter
7 transmission path
8 power line
10 charger
20 battery
30 power source
40a to 40d repeater
41 CPU
42 ROM
43 RAM
44 operation input section
45 interface section
46 display section
47 storage section
48 bus
50 abnormality detection computation section
51 computation/comparison section
52 reference database
53 to 53c reference database backup
100 to 100c power storage system
200 power storage unit
300 energy management unit
400 generator
500 system power
600 load
700 sensitivity test execution unit
A numerical value indicating incompatibility between operation data set and reference database 52

The invention claimed is:

1. A power storage system, comprising:
a power storage unit including:
a storage battery,
a charging section that charges the storage battery, and
a detection section that detects at least one status of the storage battery and the charging section;

an abnormality detection unit including:
- an input section that acquires transmission information from the power storage unit via a transmission path, the transmission information including a plurality of acquired status values,
- an abnormality detection section that detects abnormality of the power storage unit by a multivariate analysis performed on the plurality of acquired status values, wherein the abnormality detection section includes a first storage section that stores a reference data set defining a normal state of the power storage unit by a plurality of status values and a second storage section that stores a backup of the reference data set, wherein the first storage section and the second storage section comprise non-volatile memory, wherein the abnormality detection section comprises a first processor, wherein the first processor is configured to:
  - evaluate incompatibility between the plurality of acquired status values and the stored reference data set, and
  - update a reference database on the basis of an evaluation result; a repeater unit including a first control section, the first control section being provided on the transmission path connecting the power storage unit and the abnormality detection unit, wherein the first control section is configured to:
  - receive the transmission information transmitted from the detection section,
  - change a status value on the basis of a status value included in the received transmission information, and
  - transmit the transmission information including the changed status value to the input section; and
- a sensitivity test execution unit including a second control section, the second control section comprising a second processor, the second processor configured to:
  - cause the first control section of the repeater unit to transmit transmission information changed for a test to the input section,
  - cause the abnormality detection section of the abnormality detection unit to determine whether the power storage unit is abnormal or not on the basis of the received transmission information for the test,
  - in any of a case where the status value by which the power storage unit is determined to be abnormal is set in the received transmission information for the test, and the first processor determines that the power storage unit is normal, and a case where the status value by which the power storage unit is determined to be normal is set in the received transmission information for the test, and the first processor determines that the power storage unit is abnormal, cause the first processor of the abnormality detection unit to write the backup of the reference data set stored in the second storage section back to the reference data set stored in the first storage section, and
  - cause the first processor to update the reference data set stored in the first storage section, the reference data set being written back by the backup of the reference data set, on the basis of the transmission information lastly received at an actual operation.

2. The power storage system according to claim 1, wherein the first control section of the repeater unit is configured to add flag information to the transmitted transmission information, the flag information indicating that the status value has been changed.

* * * * *